(12) United States Patent
Scheruebl et al.

(10) Patent No.: US 8,730,474 B2
(45) Date of Patent: May 20, 2014

(54) METHOD AND APPARATUS FOR MEASURING OF MASKS FOR THE PHOTO-LITHOGRAPHY

(75) Inventors: Thomas Scheruebl, Jena (DE); Holger Seitz, Jena (DE); Ulrich Matejka, Jena (DE); Axel Zibold, Jena (DE); Rigo Richter, Zeulenroda-Triebes (DE)

(73) Assignee: Carl Zeiss SMS GmbH, Jena (DE)

( * ) Notice: Subject to any disclaimer, the term of this patent is extended or adjusted under 35 U.S.C. 154(b) by 556 days.

(21) Appl. No.: 12/933,226

(22) PCT Filed: Mar. 19, 2009

(86) PCT No.: PCT/EP2009/002030
§ 371 (c)(1),
(2), (4) Date: Sep. 17, 2010

(87) PCT Pub. No.: WO2009/115329
PCT Pub. Date: Sep. 24, 2009

(65) Prior Publication Data
US 2011/0016437 A1  Jan. 20, 2011

Related U.S. Application Data

(60) Provisional application No. 61/038,070, filed on Mar. 20, 2008.

(30) Foreign Application Priority Data

Mar. 20, 2008  (DE) .......................... 10 2008 015 631

(51) Int. Cl.
*G01B 11/00*  (2006.01)
*G01B 11/14*  (2006.01)
*G01N 21/00*  (2006.01)
*G01B 11/04*  (2006.01)
*G01B 11/08*  (2006.01)
*G06K 9/00*  (2006.01)

(52) U.S. Cl.
USPC ..................... 356/401; 356/237.4; 356/237.5; 356/616; 356/620; 356/636; 382/144

(58) Field of Classification Search
None
See application file for complete search history.

(56) References Cited

U.S. PATENT DOCUMENTS 5,523,841 A  *  6/1996  Nara et al. .................... 356/500
5,965,306 A  *  10/1999  Mansfield et al. ............. 430/22

(Continued)

FOREIGN PATENT DOCUMENTS

DE  102004033603  2/2006
EP  1248151  10/2002

OTHER PUBLICATIONS

International Search Report for International Application No. PCT/EP2009/002030 dated Jul. 3, 2009.

(Continued)

*Primary Examiner* — Gordon J Stock, Jr.
(74) *Attorney, Agent, or Firm* — Fish & Richardson P.C.

(57) ABSTRACT

The invention relates to a method and an apparatus for measuring masks for photolithography. In this case, structures to be measured on the mask on a movable mask carrier are illuminated and imaged as an aerial image onto a detector, the illumination being set in a manner corresponding to the illumination in a photolithography scanner during a wafer exposure. A selection of positions at which the structures to be measured are situated on the mask is predetermined, and the positions on the mask in the selection are successively brought to the focus of an imaging optical system, where they are illuminated and in each case imaged as a magnified aerial image onto a detector, and the aerial images are subsequently stored. The structure properties of the structures are then analyzed by means of predetermined evaluation algorithms. The accuracy of the setting of the positions and of the determination of structure properties is increased in this case.

25 Claims, 4 Drawing Sheets

(56) References Cited

U.S. PATENT DOCUMENTS

Figure 1:
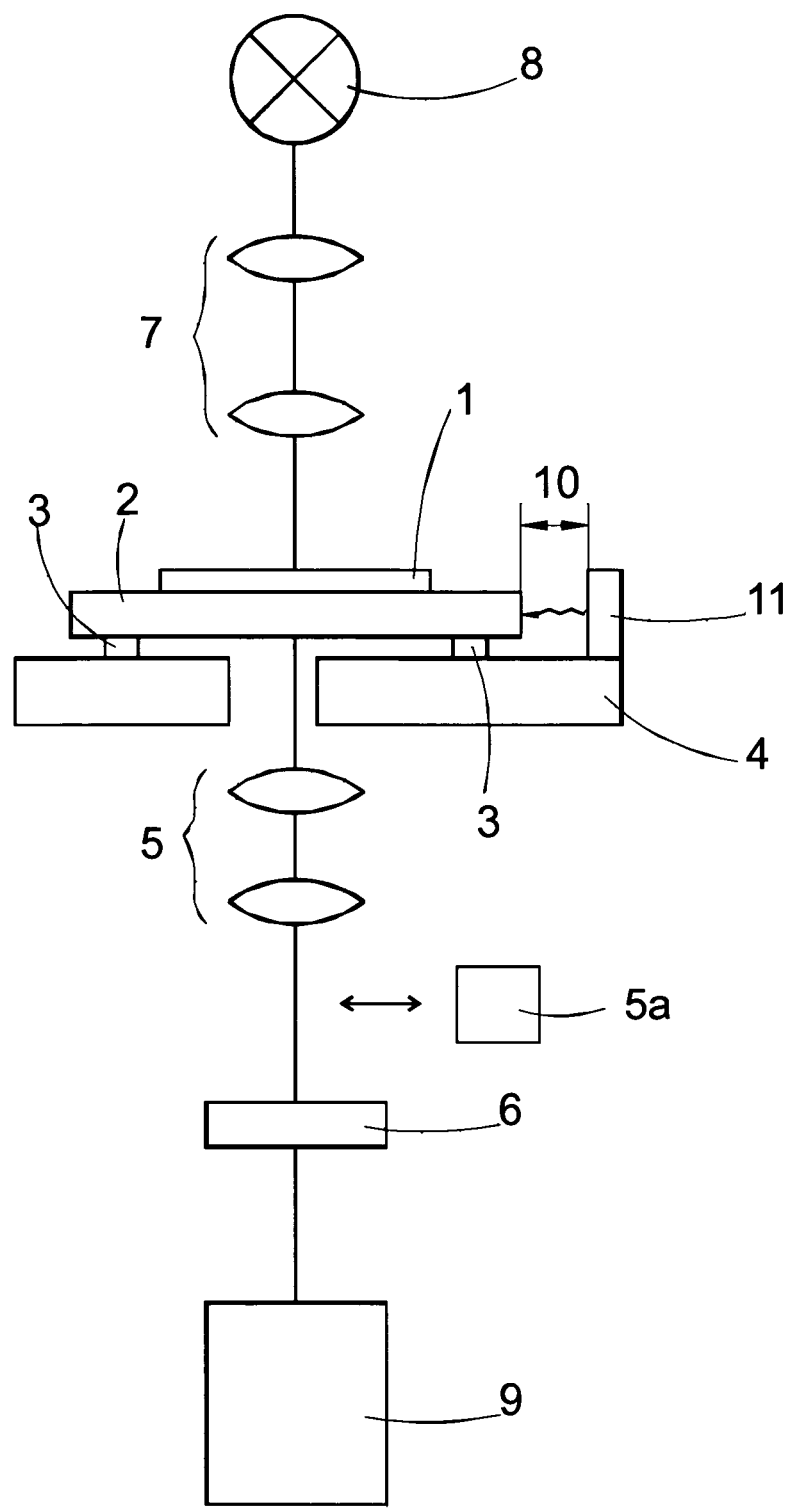

| | | | |
|---|---|---|---|
| 6,013,401 A | 1/2000 | McCullough et al. | |
| 6,292,255 B1 | 9/2001 | McCullough | 355/67 |
| 6,768,958 B2* | 7/2004 | Ivanovic et al. | 702/94 |
| 6,777,139 B2* | 8/2004 | Baselmans | 430/5 |
| 6,803,554 B2 | 10/2004 | Ye et al. | 250/208.1 |
| 7,251,015 B2* | 7/2007 | Yoo | 355/52 |
| 7,286,284 B2 | 10/2007 | Totzeck et al. | |
| 7,303,842 B2* | 12/2007 | Watson et al. | 430/5 |
| 7,389,491 B2* | 6/2008 | Park et al. | 700/121 |
| 7,443,486 B2* | 10/2008 | Van Ingen Schenau et al. | 355/69 |
| 7,488,933 B2* | 2/2009 | Ye et al. | 250/252.1 |
| 7,491,479 B2* | 2/2009 | Melvin et al. | 430/30 |
| 2002/0085190 A1* | 7/2002 | Nishi | 355/53 |
| 2004/0152024 A1* | 8/2004 | Livesay et al. | 430/394 |
| 2004/0165761 A1* | 8/2004 | Hung et al. | 382/141 |
| 2005/0264777 A1* | 12/2005 | Gardner et al. | 355/53 |
| 2006/0055899 A1 | 3/2006 | Van Der Net et al. | |
| 2006/0279743 A1 | 12/2006 | Boesser et al. | |
| 2007/0065729 A1 | 3/2007 | Zait et al. | 430/5 |
| 2007/0103667 A1 | 5/2007 | Ferber et al. | |
| 2007/0103696 A1 | 5/2007 | Pohlmann | |
| 2009/0232758 A1 | 9/2009 | Archaembault et al. | |
| 2009/0316124 A1* | 12/2009 | Kwan | 355/53 |

OTHER PUBLICATIONS

Dieter Adam et al., "First Measurement Data Obtained on the New Vistec LMS IPRO4", *Proc. of SPIE*, vol. 6533, pp. 653301-1-653301-7 (May 3, 2007).

Guy Ben-Zvi et al., "Mask CD Control (CDC) with Ultrafast Laser for Improving Mask CDU Using AIMS™ as the CD Metrology Data Source", *Proc. of SPIE*, vol. 6730, pp. 67304X-1-67304X-9 (Sep. 18, 2007).

Grant Davis et al., "Automated aerial image based CD metrology initiated by pattern marking with photomask layout data", *Proc. of SPIE*, vol. 6607, pp. 66072A-1-66072A-10 (Apr. 2007).

* cited by examiner

METHOD AND APPARATUS FOR MEASURING OF MASKS FOR THE PHOTO-LITHOGRAPHY

CROSS-REFERENCE TO RELATED APPLICATIONS

This application is the National Stage of International Application No. PCT/EP2009/002030, filed Mar. 19, 2009, which claims priority to German Application No. 10 2008 015 631.0, filed Mar. 20, 2008, and U.S. Provisional Patent Applications No. 61/038,070, filed on Mar. 20, 2008. The contents of the above applications are incorporated by reference in their entireties.

The invention relates to a method for measuring masks for photolithography, in which structures to be measured on a mask on a movable mask carrier are illuminated and imaged as an aerial image onto a detector, the illumination being set in a manner corresponding to the illumination in a photolithography scanner during a wafer exposure. In this case, a selection of positions at which the structures to be measured are situated on the mask is predetermined; the positions in the selection on the mask are successively brought to the focus of an imaging optical system, where the structures are illuminated, and wherein they are in each case imaged as a magnified aerial image onto the detector, and wherein the aerial images are stored. Structure properties are then analyzed by means of predetermined evaluation algorithms.

The invention also relates to an apparatus for measuring masks for photolithography. Such an apparatus comprises a moveable mask carrier, which accommodates the mask, a positioning device, which stops at predetermined positions on the mask at which structures to be measured are situated, such that said structures are situated at a focus of an imaging device, wherein the imaging device in each case generates an aerial image of the structure and images it onto an areal detector. It additionally comprises an illumination device, which illuminates the mask and which is set in a manner corresponding to an illumination in a photolithography scanner during a wafer exposure. Finally, such an apparatus also comprises an evaluation unit, which evaluates the detected aerial images of the structures which regard to structure properties, in particular to complying with predetermined tolerances.

In the production of semiconductor structures such as are used in computer technology in processors and recently increasingly also in exchangeable storage media, development is tending toward producing ever smaller structures on the same area. Currently available computer chips comprise approximately thirty different layers lying one above another, and the size of the functional structures, of the so-called features, is approximately 45 nm. The photolithography masks used for producing these features have to be produced with correspondingly high accuracies. In the context of producing a photolithographic mask, the mask is analyzed prior to its use to the effect of whether there are situated on the mask structures or incorrect structures which, during the exposure of a wafer, might result in the desired structure not being produced on the wafer. For this purpose, a number of positions at which possible candidates for such defective exposures may be situated are generally selected on the mask. This selection is effected manually or automatically, on the basis of an analysis of the so-called mask design file, which contains the topography of the mask in encrypted form and on the basis of which the mask is produced. The analysis of the properties of the selected structures, for example of the critical dimension (CD), of the lithographic process window (PW) or of the possible exposure latitude (EL), is usually effected using special apparatuses and/or special evaluation methods. By way of example, the critical dimension, abbreviated to CD hereinafter, is generally examined by means of a scanning electron microscope (SEM). Such a microscope is distinguished by a high spatial resolution. Other measuring methods for determining the critical dimension use a short wave-length—such as 248 nm for example—in combination with a high numerical aperture, such that a high optical spatial resolution is obtained in this way. In both methods, the CD is determined from the measurement signal, that is to say the intensity distribution in the image, generally on the basis of a threshold value algorithm—that is to say the predetermination of a threshold value for an intensity difference which is necessary for the presence of an edge. The critical dimension thus determined is then generally calibrated against a so-called golden mask. Such a golden mask is measured beforehand by means of various independent methods, and then the data obtained are used to determine a calibration value for the critical dimension for example with the aid of models. The same also applies to a so-called golden wafer print, that is to say an exposed wafer, that is likewise measured by various methods.

In these methods, the measuring apparatuses are calibrated against the structures on the photomask. For the lithographic behavior of a mask, however, the critical dimension that results on the wafer after the imaging of the mask by means of a photolithography scanner is of greater significance. The crucial variable for this is the so-called Mask Error Enhancement Factor (MEEF), which indicates the behavior of the CD on the wafer in the case of changes in the CD on the mask, where an MEEF of 1 means that all of the different critical dimensions on the mask are imaged into critical dimensions on the wafer in the same way.

In order to produce ever smaller structures on a mask, so-called OPC or RET features (OPC=Optical Proximity Correction, RET=Reticle Enhancement Technique) are used. With the use of these features having dimensions smaller than the resolution capability of an imaging unit used, the diffraction behavior of the mask can be controlled in a targeted manner in order to produce a correct imaging even in the case of structures of the order of magnitude of the exposure wavelength—for example 193 nm. These features crucially influence the critical dimension on the wafer or the MEEF. They are not resolved during the imaging and act correctly only under the imaging conditions set. Although structures having such features can also be measured by means of an SEM, various disadvantages have to be accepted. Thus, the effect of the mask structures with regard to the lithographic imaging is not detected and a statement with regard to the MEEF cannot be made. Structures which are smaller than the resolution capability can be measured only with difficulty or require a high outlay. The lithographic effect can only be detected by a downstream simulation of the effect of the mask on a photoresist layer, but this is time-consuming and is beset by uncertainties. Finally, a calibration is effected only against a golden mask and not against a lithographic CD such as is present on the wafer.

In order to improve the analysis of the critical dimension in particular with regard to the structures that are becoming ever smaller, an imaging device can be included in the analysis, which generates an aerial image of the mask. Said aerial image is used under the same illumination conditions and with the same optical settings as are used in a photolithography scanner. The only difference is that the image of the mask is imaged onto an areal detector, for example onto a CCD or CMOS array, in magnified form, while the imaging of the mask on the wafer in the scanner is effected with demagnification. The aerial image of the mask thus corresponds to an imaging of the mask onto the photo-resist layer, represented in magnified form. In this way it is possible to determine the lithographic CD, that is to say that critical dimension which would be valid during a real exposure of the wafer.

Such an apparatus for generating aerial images of a mask is for example the AIMS™ from Carl Zeiss SMS GmbH. The inclusion of the AIMS™ in the measurement of the critical dimension is described for example in an article "Automated Area Image Based CD Technology . . . " by G. Davis and S. Y. Choi et al., published in "Photomask and Next-Generation Lithography Mask Technology XIV", edited by Hidehiro Watanabe, Proc. of SPIE Vol. 6607, 66072A, (2007). On the basis of a mask design file containing the topography of the mask or the production stipulations for the mask in a format that can be read by a corresponding machine, a simulation aerial image of the mask is generated, though the AIMS is not required per se for this purpose. Said simulation aerial image corresponds to an ideal imaging of the mask without defects. The aerial image of the real mask is oriented to the simulation aerial image, for example with the aid of pattern recognition algorithms or correlation algorithms, in order to fit the predetermined measurement regions. In this case, the same illumination conditions as are used in the AIMS for recording the aerial image of the real mask are set during the generation of the simulation aerial image. The recorded AIMS images of the measurement positions or structures are stored electronically, such that the measurement position on the mask can be assigned to an AIMS aerial image. In a downstream analysis, a user can then determine the critical dimension at the measurement locations and the distribution of the CD over the mask, the so-called CD uniformity (CDU), can be represented as a table or graphically as a so-called CD map. In this case, it is also possible at the same time to assess whether the critical dimensions are correct at the structures to be examined, or whether corrections have to be made.

In order to determine process windows, the AIMS can be used to measure focus stacks (through focus analysis). In other words, aerial images of spaced-apart parallel planes are recorded in addition to the best focal plane. Thus, for example 7 planes are measured which are at the same distance from one another, three below and three above the best focal plane. The critical dimension (CD) or the exposure latitude (EL) can thus be plotted against the focus in order to represent the process window.

What is disadvantageous about the method just described is, inter alia, that when determining the CD, an intensity threshold value has to be chosen and, consequently, there is a certain arbitrariness when determining the absolute CD value. In addition, ever smaller structures are being produced on the masks and, consequently, the structures or structure properties to be measured, such as the critical dimension, are also becoming smaller and smaller. The methods mentioned above are therefore encountering their limits, which imposes limits on the accuracy during position determination also on the basis of the orientation of aerial image and simulation aerial image to one another; the accuracy is essentially determined there by the quality and similarity of the simulated aerial image. Dimensions of the order of magnitude of between 100 nm and 180 nm will have to be measured in the future, and the hitherto achievable accuracy is not sufficient for this, further accuracies of ±50 nm in the position determination are being required.

It is an object of the invention, therefore, to develop a method and an arrangement which make it possible to determine the positions of structures to be measured on masks for photolithography with higher accuracy, preferably under the imaging conditions of a photolithography scanner. If the critical dimension is measured, the latter is furthermore also intended to be determined with higher accuracy. In general, the intention is to improve the accuracy of determining structure properties of the mask.

In the case of a method of the type described in the introduction, this object is achieved by virtue of the fact that the setting of the position is interferometrically checked, and if appropriate corrected, on the basis of at least one measurement section. With the aid of an interferometric measurement system, the accuracy during position determination can be improved to approximately ±10 nm, so such a method satisfies the future requirements made of the accuracy of position determination. In this case, the measurement sections can advantageously be purged with a purge medium; in this way, the atmosphere in which the interferometer beams run can be kept constant to a greater extent. Examples of a suitable purge medium include nitrogen, argon, helium, oxygen, and also water, if appropriate, if the device is designed therefor. The purge medium can additionally be conducted through a thermal low-pass filter that filters out high-frequency temperature fluctuations. Since, with a single measurement section, the accuracy during position determination can generally only be increased for a single degree of freedom, generally use will be made of as many measurement sections as there are degrees of freedom in which the mask or the mask carrier can be moved. In order to increase the accuracy further, redundant interferometric measurements are carried out for at least one of the degrees of freedom in which the mask can be moved, but preferably for all the degrees of freedom. Preferably, therefore, the setting of the position for at least one of the degrees of freedom in which the mask carrier can be moved is interferometrically checked, and if appropriate corrected, on the basis of two measurement sections. Furthermore, the accuracy of the setting of the position is increased by the use of measurement rods. A further possibility is position determination by orienting the aerial image of the real mask to the simulation aerial image by means of a correlation algorithm, that is to say the superimposition of the measured image excerpt with the aerial image simulated from the mask design.

In order to increase the accuracy of the determination of the structure properties, it is necessary to comply with or simulate or emulate the imaging conditions of the scanner as accurately as possible. Thus, it is necessary to emulate in particular the vector effects which occur in the case of scanners with high numerical apertures.

For an apparatus of the type described in the introduction, the object is achieved by virtue of the fact that the positioning device contained in the apparatus has for position determination at least one interferometric measurement section coupled to the mask carrier. In particular, the method just described can be carried out by means of such an apparatus. With the use of one interferometric measurement section, generally the accuracy is only increased for one degree of freedom and this may suffice depending on the type of setting, for example if a more accurate positioning is already possible in the other degrees of freedom; expediently, however, the positioning device has for each degree of freedom an interferometric measurement section coupled to the mask carrier. In order to increase the accuracy further, redundant measurements can be carried out, for example by virtue of the positioning device having two interferometric measurement sections for each degree of freedom in which the mask carrier can be moved. The values obtained from the two measurements for position determination are then averaged. Naturally, even further interferometric measurement sections can likewise be provided; the more interferometric measurement sections there are, the more complicated and more cost-intensive the construction becomes, however.

In order to further increase the accuracy during position determination, the apparatus can also have, instead of or to supplement the redundant interferometric measurement sections, a purging device for purging the measurement sections with a purge medium. The purging device can be coupled to a thermal low-pass filter that filters out high-frequency temperature fluctuations and thus provides for a more uniform temperature over time. For control purposes, it is possible moreover to provide one or more etalons with which reference sections of constant length are measured. Temporal fluctuations can be taken into account in this way. Positioning devices and mask carriers are preferably mounted on a sample table composed of Zerodur. The advantage of Zerodur is that this material exhibits practically no thermal expansion that could likewise influence the position determination. It goes without saying that other materials having a similar coefficient of thermal expansion, for example Invar, can also be used instead of Zerodur.

As a further possibility for increasing the accuracy of the position determination, the positioning device has for position determination at least one measurement rod coupled to the mask carrier. Here a scale arranged in the measurement rod is scanned contactlessly by a scanning head during movement of the mask carrier and the change in the position of the mask carrier is thus determined highly accurately. Here, too, the use of one measurement rod per degree of freedom is expedient. The accuracy is increased by redundant measurement rods. The combination of measurement rods and interferometric measurement sections is possible.

Ever diminishing object structure sizes require ever larger imaging-side numerical apertures of scanners. However, the angles of incidence that are also becoming ever larger as a result give rise to the so-called vector effects in which tangentially and radially polarized radiation components have different intensity profiles. It is found that the radiation components which oscillate parallel to the plane of incidence spanned by direction of incidence and normal to the surface of the substrate (s-polarized) interfere better and thus generate a better contrast than the radiation components oscillating perpendicular thereto (p-polarized). These so-called vector effects lead to a decreasing contrast for p-polarized components of the radiation and, as a result, to a decreasing overall contrast in scanners with large imaging-side numerical apertures.

While the scanner images the mask structure onto the carrier to be exposed in demagnified form, during mask inspection by contrast the structure is imaged onto a detector in magnified form. The mask-side numerical aperture is identical in both systems. The p-polarized radiation components are thus imaged differently during the imaging of a mask by a scanner than by an apparatus for measuring masks such as the AIMS, for example. By virtue of the magnified imaging of the mask on a detector embodied as a CCD matrix, the imaging-side numerical aperture is extremely small in this case, with the result that vector effects do not occur. If an apparatus for measuring masks such as the AIMS, for example, is then used to examine masks, the vector effects occurring in the scanner used should be taken into account for accurately determining the structure properties. This is achieved by emulation of the vector effects. For emulation purposes, polarization-active optical components for generating different polarization states are arranged in the illumination beam path and/or in the imaging beam path.

While the positions at which the structures are intended to be examined can also be selected manually on the basis of an aerial image or the layout of the mask, this process can be automated, such that, in one preferred configuration, the positions at which the critical structures to be measured are situated are predetermined on the basis of an input file. Said input file can be generated automatically with the aid of corresponding analysis tools.

For each position to be measured it is possible to define the measurement conditions, the number of focal planes to be measured at each position, and at least the determination of the following structure properties: critical dimension (CD), normalized image log slope (NILS), depth of focus (DOF) as a function of the exposure latitude (EL), EL as a function of the DOF. For the optical comparison of a recorded aerial image with the simulated aerial image of the same excerpt from a structure, it is possible to represent superimpositions of the images with highlighting of the differences between the two images.

As an alternative or supplementation to the use of interferometric measurement sections and/or measurement rods, the accuracy can also be obtained or improved with the aid of a simulation aerial image of the mask. In this case, a respective simulation aerial image is generated on the basis of a mask design file, according to the stipulation of which the mask is produced, for the structures. For each structure, the aerial image of the real mask is then oriented to the simulation aerial image by means of a correlation algorithm, whereby more accurate position determination is made possible.

In this case, the apparatus properties of an imaging device used for imaging as aerial image—for example of the AIMS—which can influence the aerial image are taken into account when generating the simulation aerial image, such that a calibrated aerial image is generated. Said apparatus properties include, in particular, those which can influence the behavior during imaging and illumination, for example the illumination wavelength, the imaging scale, the illumination homogeneity, the numerical aperture, aberrations, the occurrence of vector effects, etc. In this way it is possible to generate a simulation aerial image which becomes more similar to the measured aerial image and thus enables a better correlation and hence orientation or positioning of the measurement location.

If the positions of the structures are determined with the required accuracy, then the values for the critical dimension can be determined as structure properties on the basis of the aerial image, for example by means of a threshold value algorithm on the basis of a predetermined threshold value. By way of example, an intensity which is defined on the basis of the minimum and maximum measured intensity values, e.g. as half of their difference, can be used as the threshold value. Other structure properties, such as the process window or the illumination latitude, can then also be determined on the basis of the aerial image. In particular, the method enables a measurement of the homogeneity of the critical dimension on the mask, of the so-called CD uniformity, for a predetermined structure.

A calibration of the critical dimension can then be performed for example with the aid of a golden mask or of a so-called golden wafer print. Vector effects can also subsequently be taken into account by means of a downstream algorithm in the aerial image. A further calibration can be performed on the basis of a simulation aerial image. From the mask design file or the wafer layout it is possible to determine the critical dimension at least required, the so-called target CD, and also locations at which it is present. These locations are identified in the simulated aerial image, and, by means of an algorithm, the threshold value for the target CD can then be determined on the basis of the simulated intensity differences. This value can then be used to calibrate the measured aerial image and the actual critical dimension of the structure is obtained.

Furthermore, the aerial image can also be used to carry out a simulation of the exposure (resist simulation).

Finally, it is also possible to use an energy monitor in the system, which energy monitor is positioned as much as possible in proximity to the mask. The energy monitor measures the radiation incident on the mask. Fluctuations can be taken into account in this way and included for correction of the intensity image. The illumination with the predetermined wavelength can be effected using a correspondingly set laser—a filtered broadband laser or a single-wavelength laser. The laser can moreover be cooled in order to achieve a high throughput. Further structure properties which can likewise be determined are the LER (Line Edge Roughness), LWR (Line Width Roughness), the contact hole diameter and the integrated intensity in the contact hole, to name just a few.

It goes without saying that the features mentioned above and those yet to be explained below can be used not only in the combinations specified but also in other combinations or by themselves, without departing from the scope of the present invention.

Figure 2:
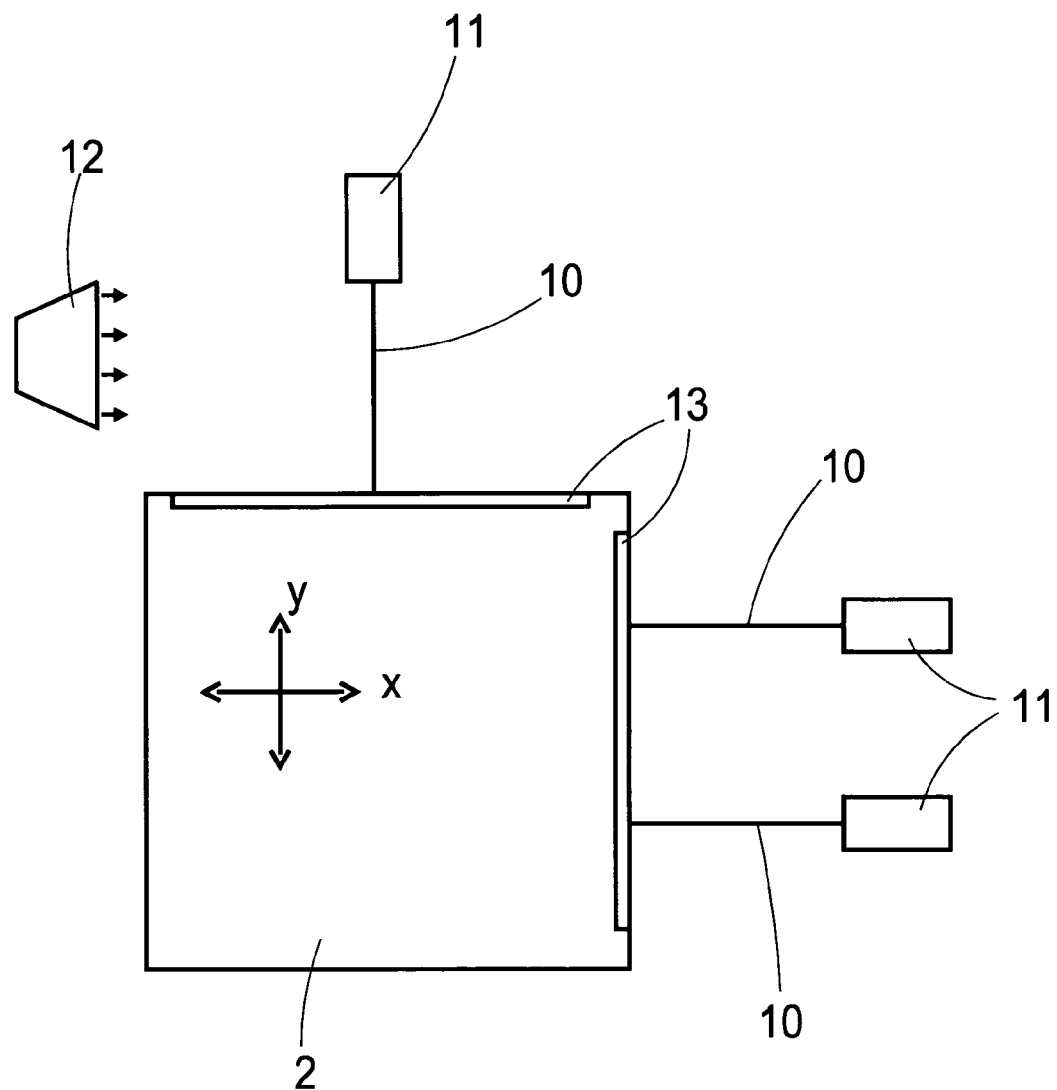
Figure 3:
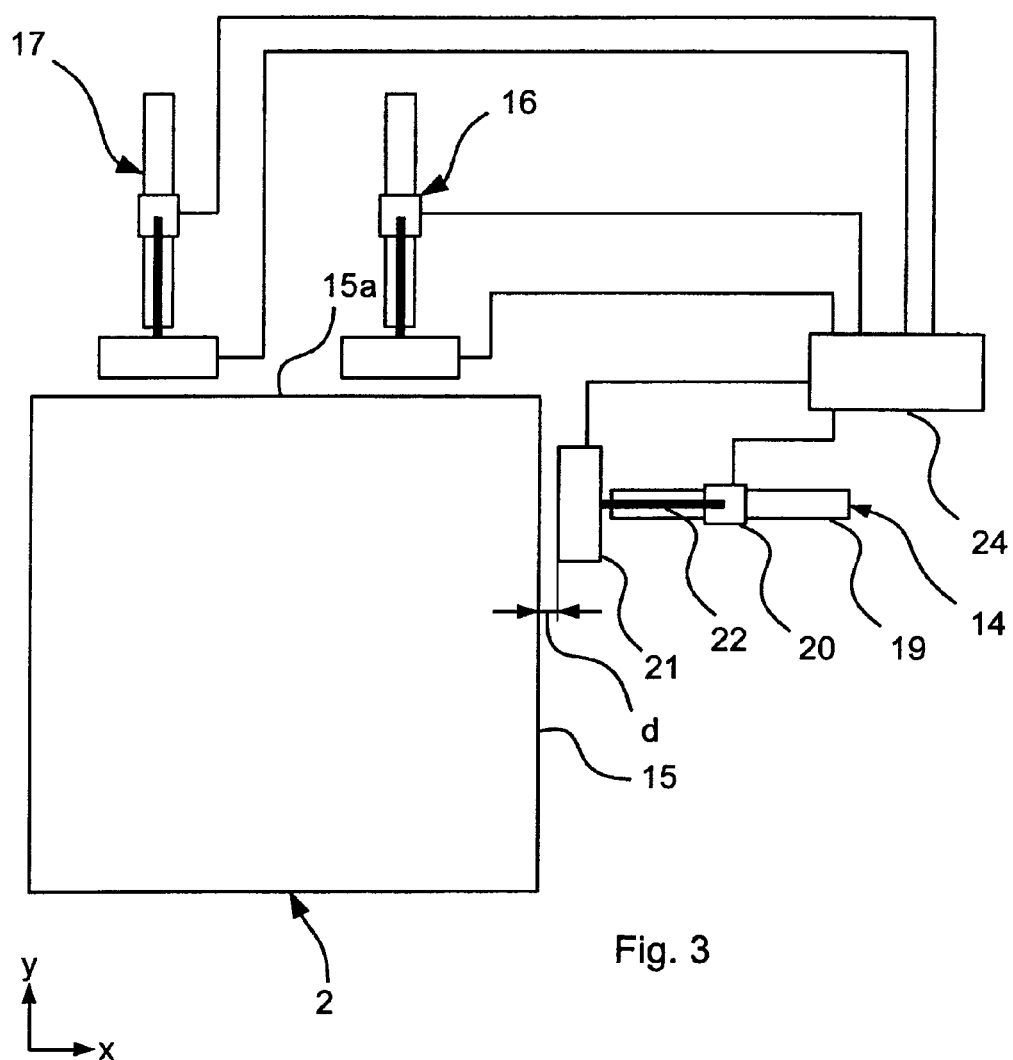
Figure 4:
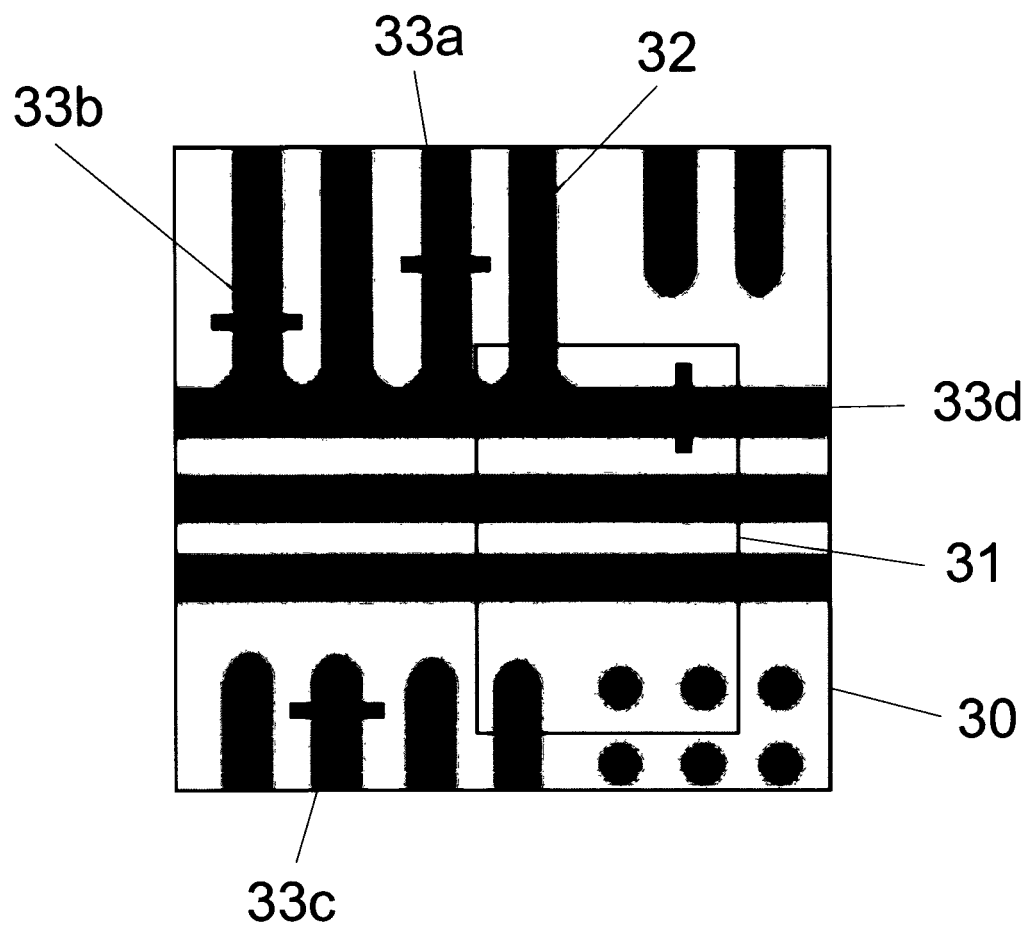

The invention is explained in even greater detail below by way of example on the basis of the accompanying drawings, which also disclose features essential to the invention. In the drawings:

FIG. 1 shows an apparatus for measuring masks for photolithography comprising an interferometric measurement section, FIG. 2 shows the positioning device in a plan view in detail, FIG. 3 shows a further positioning device in a plan view in detail, FIG. 4 shows the positioning on the basis of a simulation aerial image for determining the CD.

FIG. 1 shows the basic construction of an apparatus for measuring photolithography masks. A mask 1 is mounted on a mask carrier 2. The mask carrier 2 can be moved, and if appropriate rotated, in all three spatial directions; here it lies in a rest position on bearings 3 on a sample table 4. The apparatus has a positioning device, which stops at predetermined positions on the mask 1 at which structures to be measured are situated, such that said structures are situated at the focus of an imaging optical system 5. The imaging optical system 5 in each case generates an aerial image of the structure or of the excerpt from the mask on which the structure is situated, and images said excerpt onto an areal detector 6, for example a CCD camera. The mask 1 is illuminated by means of an illumination device comprising an illumination optical system 7 and a light source 8, the illumination being set in a manner corresponding to the conditions which prevail in a photolithography scanner during the wafer exposure. This concerns both the wavelength used and the illumination optical system 7. A laser, for example, having a wavelength of 193 nm, can be used as the light source 8. Connected to the detector 6 is an evaluation unit 9, which evaluates the detected aerial images of the structures with regard to structure properties, in particular with regard to complying with predetermined tolerances.

The positioning device comprises for position determination at least one interferometric measurement section 10 coupled to the mask carrier 2. By means of interferometrically checking the difference in path distance or the absolute path distance, it is possible to position the mask 1 or the mask carrier 2 with an increased accuracy of approximately 10 nm, while without an interferometric measurement section 10 the accuracy is only approximately 100 nm or above. In this way, even relatively smaller structures can be accurately set and subsequently analyzed. The interferometric measurement section is defined by an interferometer 11, which emits a measurement beam that is reflected by the mask carrier 2. The setting of the position is checked, and if appropriate corrected, on the basis of the measurement beam. The interferometer 11 is usually a laser interferometer.

FIG. 2 shows the arrangement with the mask carrier 2 in a plan view, where only the essential elements have been illustrated. The mask carrier 2 is large enough to accommodate a mask 1 for photolithography; such a mask measures approximately 15×15 cm. Its mobility in the X and Y directions, represented by the crossed arrows, is likewise of the order of magnitude of the extent of the mask 1 in these directions. The mask carrier 2 can furthermore also be movable in the Z direction, not shown here, in order to bring the mask 1 to the focus of the imaging device. The imaging optical system 5 is generally very solid and therefore often stationary. In this exemplary embodiment, three interferometers 11 are arranged on the sample table 4, which is not depicted here. In this case, the movement of the mask carrier 2 in the Y direction is monitored by a single interferometer 11, and in the X direction the position adjustment is supervised by two interferometers 11. The accuracy can be increased by the use of two interferometers 11. The accuracy is increased with respect to the Y direction by virtue of the measurement section 10 defined by the corresponding interferometer 11 being purged with purge gas from a purging nozzle 12. A further interferometer is not absolutely necessary in this case. Mirrors 13 are fitted at an X and Y edge of the carrier, said mirrors reflecting the measurement beams emitted by the interferometers 11. Supplementarily, it is additionally possible, not shown here, to provide etalons transversely with respect to the course of the measurement section and intersecting the latter, in order to further increase the accuracy of the measurements. The interferometers 11 can be calibrated in a time-dependent manner with the aid of the etalons.

A further example of a positioning device is illustrated in FIG. 3. In order that the mask carrier 2 can then be positioned highly accurately, it has a first measurement rod 14 at a first side 15 and two measurement rods 16, 17 at a second side 15a of the mask carrier 2 (FIG. 3). Since the measurement rods 14, 16 and 17 all have the same construction, only the measurement rod 14 is described in detail below.

The measurement rod 14 comprises a scale 19 extending in the x direction and a scanning head 20, the relative position of which in the x direction can be detected, and also a sensor head 21, which is fixed to the scanning head 20 via a mechanical connection 22. The sensor head 21 is embodied as a capacitive sensor head and positioned at a predetermined distance d in front of the first side 13.

The scanning head 20 has a motor and can be moved along the x direction, a movement of the scanning head 20, on account of the mechanical connection 22, also equally being a movement of the sensor head 21. Consequently, the scanning head 20, the sensor head 21 together with the mechanical connection form a moveable measuring unit 23.

The scale 19 is mechanically decoupled from the mask carrier 2. A movement of the mask carrier 2 therefore does not lead to any movement of the scale 19.

A control unit 24 is connected to the sensor head 21 and the scanning head 20. The control unit 24 serves to control the drive of the scanning head 20 in a manner dependent on the distance signal output by the sensor head 21 in such a way that the distance between the sensor head 21 and the first side 15 of the mask carrier 2 always remains constant. In the event of a movement of the mask carrier 2 in the x direction, this then has the effect that the scanning head 20 is moved relative to the scale 19. This change in position can be determined highly accurately by means of the scanning head 20 and be output to the control unit 24, such that the position of the table 2 in the x direction can be determined highly accurately there-from.

As an alternative or supplementation to the use of interferometric measurement sections, the positioning accuracy can also be obtained or improved with the aid of a simulation aerial image of the mask. In this case, the expected aerial image of the mask region to be measured is simulated on the basis of the mask design file. This simulation is carried out by means of the Calibre Workbench from Mentor Graphics. FIG. 4 shows an example for measuring the critical dimensions CD at the positions 33a to 33d of the structure 32 of the measured aerial image 30. The positions 33a to 33d are defined in the mask design. For accurately determining for example the position 33d in the aerial image 30, the aerial image 31 is simulated. FIG. 4 shows the measured aerial image 30 and the simulated aerial image 31 after orientation has been effected.

For each structure, that is to say each position to be measured, the aerial image of the real mask is then oriented to the simulation aerial image by means of a correlation algorithm, whereby more accurate position determination is made possible. Then either the position of the mask carrier 2 is corrected or the measured position of the respective structure features to be determined is correspondingly corrected.

The differences in the color values of the pixels of the two images which lie one above another are calculated pixel by pixel as correlation algorithm. The absolute differences in the grey-scale values of the individual pixels which lie one above another during the respective displacement are summed. The images are displaced relative to one another pixel by pixel until a minimum of the summed differences is attained. The starting point of the calculation is the position of the aerial image in accordance with the desired value of the position of the mask carrier and the position of the simulated image in the mask design.

In a further configuration the distance between the images is calculated by cross-correlation. Cross-correlation of the images yields a correlation pattern, the maximum of which is determined. The position of this maximum corresponds to the distance between the images. If the first image is present as matrix A and the second image as matrix B, then the following holds true:

$$corr = ifft[fft(A) \cdot conj(fft(B))]$$

In this case, corr is the cross-correlation, ifft is the inverse Fourier transform, fft is the Fourier transform and conj is the conjugate. The images are then displaced relative to one another until a minimum of the distance between the two images is attained.

With the apparatus shown in FIGS. 1, 2 and 3, the conditions prevailing in a photolithography scanner can essentially be simulated, which is a prerequisite for the imaging of the mask as aerial image corresponding to the imaging of the mask on the photoresist in the scanner. The light source can thus be operated with a wavelength of 193 nm, for example. The illumination device additionally encompasses possibilities for further adapting the illumination conditions to the conditions prevailing in the scanner. Thus, different diaphragms can be provided and different illumination techniques such as dipolar and/or quadruple illumination can likewise be established; the numerical aperture is also modeled on the scanner system. The scanner temperature, inter alia, can be set at the imaging optical system 5.

The arrangement shown in FIG. 1 is designed for transmitted-light examination; it goes without saying and is implicitly included for the person skilled in the art that reflected-light arrangements are also conceivable, which can be used for example to examine masks for the far UV range (EUV—extended ultra-violet). Such masks are operated in reflection, that is to say that the reflected light has to be directed onto the detector 6.

It is not necessary for the whole mask to be measured, but rather only those structures which might later prove to be critical with regard to complying with predetermined tolerances during the imaging on the photoresist. Aerial images are typically recorded at 100, 300 or up to 1000 positions per mask. Such structures, which are referred to as "hot spots" or ROIs (regions of interest), are selected beforehand by means of known algorithms or manually on the mask on the basis of a mask design file containing the topography or the layout of the mask. For determining a CD map, for example, preferably periodic or regular structures are selected. For analyzing the design, critical regions, so-called hot spots. Use is made of the Calibre Metrology Interface (CMi), which is part of the Calibre WORKbench, a "layout viewer" from Mentor Graphics. The CMi creates an output file in the XML format. Said output file contains, as required:

- All the measurement conditions, such as e.g. wavelength of the light source, the structure properties to be measured such as CD, NILS, DOF, EL, LWR, contact hole diameter.
- Indications about focus stacks to be measured, that is to say number and position of the planes to be measured. For example 5 or 7 equidistant planes within 80% of the DOF are selected here, the central plane being the best focal plane.
- All positions on the mask and in the mask design at which aerial images are recorded; the coordinates of the center of the image to be measured are specified.
- The positions, size and situation (width, length, angle) and target values of the structure properties to be determined (e.g. of the positions 33 a to d in FIG. 4).
- The assignment of the simulated aerial images to the aerial images to be recorded and to the positions of the structure properties to be measured on the mask. For each position of a structure property to be measured, the file name of the associated simulated image is specified. A simulated aerial image can also comprise a plurality of positions of a structure property to be measured and be correspondingly assigned thereto.
- Predetermination of the evaluation algorithms for evaluating the measured structure properties. Statistical functions can thus be implemented. If the CD of a structure unit of "lines and spaces" is measured, for example, the determination of the average of more measurements of the same target size can be predetermined. It is also possible to represent virtually any structure properties as a function of one another and over all focal planes. Thus for example the CD over the location as a CDU map or normalized image log slope (NILS), depth of focus (DOF) as a function of the exposure latitude (EL) or EL as a function of the DOF. A further possibility for evaluation is the representation of the superimposition of the recorded aerial image with the simulated aerial image of the same excerpt from a structure. Deviations of the superimposed images from one another are then represented in the manner highlighted in color.

In an automated process, these data (preferably as an XML file) together with the mask can be transferred to the apparatus described above, and the positions in the selection are then successively moved to on the mask 1, that is to say brought to the focus of the imaging optical system 5, where they are illuminated and in each case imaged as a magnified aerial image onto the detector 6. The structure properties are subsequently analyzed by means of predetermined evaluation algorithms in the evaluation unit 9. This comprises an analysis of the critical dimension, for example, wherein non-visible structures such as OPC or RET corrections can also be taken into account during the procedure described. Other structure variables are the process window, for example, that is to say the possible setting range for a selection of parameters within which the mask is imaged correctly onto the photoresist such that no defects arise. During the analysis of the different structures on a mask, it is also possible, moreover, to determine the largest common process window for the different mask structures and hence the process window of the mask altogether. The apparatus for measuring photolithography masks creates an output file in the XML format from all the measurement results. Said output file contains, in particular, the structure properties determined, such as CD or NILS for example, at the respective positions. The CD values can then be used for example directly for the correction of the mask by a CDC200 from Pixer; the technique is described in US2007065729. Here the critical dimension is altered in a targeted manner by local corrections of the transmission of the mask. The transmission is varied by producing inhomogeneities in the carrier material of the mask by means of femtosecond lasers. A further use of the output values is the adaptation of the exposure in the scanner, during the exposure of wafers. For the adaptation or for the compensation of the variations of line widths on the mask during the exposure of wafers, it is possible for example to vary the gap width of the scanner illumination. This and further correction possibilities are described for example in US6013401, US2009232758 or EP1248151.

After the orientation of the aerial image has been effected or after the determination of the position of the structures in the aerial image has been effected, it is possible to determine the structure properties, for example it is possible to determine the values for the critical dimension by means of a threshold value algorithm on the basis of a predetermined threshold value. It is thus possible to determine the uniformity of the distribution of the CD on the mask (CDU). Furthermore, in addition it is also possible for the critical dimension to be calibrated on the basis of a golden mask or a golden wafer print. A further calibration can be performed on the basis of a simulation aerial image. From the mask design file or the wafer layout, it is possible to determine the critical dimension at least required, the so-called target CD, and also locations at which it is present. These locations are identified in the simulated aerial image, and, by means of an algorithm, it is then possible to determine the threshold value for the target CD on the basis of the simulated intensity differences. With this value, it is then possible to calibrate the measured aerial image, and the actual critical dimension of the structure is obtained.

In the aerial image, too, it is possible, of course, to take account of imaging errors such as aberrations and vector effects, for example by means of a downstream algorithm. In this way, the aerial image is generated more closely to the real imaging such as would be effected in the photolithography scanner. The recorded aerial image can moreover be used as input data record for a method in which the exposure of the photoresist is simulated. This is expedient particularly when examining a plurality of masks which are successively imaged on the wafer or on photoresist. When examining a plurality of masks, it is also possible to determine the largest common process window for the different mask structures. The light source 8 can be cooled, moreover, in order to achieve a high throughput. Finally, in order to improve the reproducibility, it is possible to provide an energy monitor near the mask in the system, for example on the sample table, which monitor measures the energy of the radiation incident on the mask and takes this into account for the correction of the intensity image. It is thus possible to correct drifts or energy fluctuations of the light source, which leads to a better accuracy and reproducibility of the measurement results.

For simulating the numerical aperture of the scanner, on the imaging side the vector effects should be taken into consideration at high apertures such as are used in immersion systems. Said vector effects are emulated. This involves optionally arranging polarization-active optical components for the generation of different polarization states of the illumination radiation in the illumination beam path and/or in the imaging beam path for the selection of the different polarization components of the imaging radiation. In this case, an optical component having a polarization-dependent intensity attenuation function can be introduced into the imaging beam path. The polarization-active components and the components having the polarization-dependent intensity attenuation function are illustrated as structural unit 5a in FIG. 1 and can be introduced into the beam path in any desired combination. The detector records images of the mask and/or sample for differently polarized radiation components. An evaluation unit subsequently combines the images for differently polarized radiation components to form a total image. This is done for example by adding their intensity distributions. In this case, the polarization-active components are arranged in a structural unit 5a (FIG. 1) which can be introduced into the beam path as required (see the arrow). The method and the apparatus are described in DE102004033603 and U.S. Pat. No. 7,286,284, respectively.

LIST OF REFERENCE SYMBOLS

1 Mask
2 Mask carrier
3 Bearing
4 Sample table
5 Imaging optical system
5a Structural unit comprising polarization-active components and components having a polarization-dependent intensity attenuation function
6 Detectors
7 Illumination optical system
8 Light source
9 Evaluation unit
10 Interferometric measurement section
11 Interferometer
12 Purging nozzle
13 Mirror
14 Measurement rod
15 First side of the mask carrier 2
15a Second side of the mask carrier 2
16 Measurement rod
17 Measurement rod
19 Scale
20 Scanning head
21 Sensor head
22 Connection
24 Control unit
30 Measured aerial image
31 Simulated aerial image 32 Structure of the mask
33a to d Positions at which the CD is measured

The invention claimed is:

1. A method for measuring masks for photolithography, in which
structures to be measured on a mask on a movable mask carrier are illuminated and imaged as an aerial image onto a detector, the illumination being set in a manner corresponding to the illumination in a photolithography scanner during a wafer exposure,
a selection of positions at which the structures to be measured are situated on the mask is predetermined,
a constant distance between the movable mask carrier and a sensor head is maintained, in which the sensor head is coupled to a scanning head that scans a scale to determine a position of the scanning head, from which a position of the mask is determined,
the positions in the selection on the mask are successively brought to a focus of an imaging optical system and in each case imaged as a magnified aerial image onto the detector, the aerial images being stored,
and structure properties are analyzed by means of predetermined evaluation algorithms.

2. The method as claimed in claim 1, wherein a setting of the positions is effected on the basis of at least one measurement rod.

3. The method as claimed in claim 1, wherein the aerial image of the mask is oriented to a simulation aerial image by means of a correlation algorithm.

4. The method as claimed in claim 1, wherein vector effects of a scanner to be used are emulated.

5. The method as claimed in claim 1, wherein critical dimension values are determined as structure properties on the basis of the aerial images.

6. The method as claimed in claim 1, wherein critical dimension values are determined as structure properties on the basis of the aerial images by means of a threshold value algorithm on the basis of a predetermined threshold value.

7. The method as claimed in claim 1, wherein a setting of the positions is interferometrically checked, and if appropriate corrected, on the basis of at least one measurement section.

8. The method as claimed in claim 5, wherein the values for the critical dimension are calibrated on the basis of a golden mask or a golden wafer print.

9. The method as claimed in claim 5,
wherein the uniformity of the distribution of the critical dimension on the mask (CDU) is determined.

10. The method as claimed in claim 6,
wherein the threshold value is defined on the basis of a predetermined critical dimension in a simulated aerial image.

11. The method as claimed in claim 6,
wherein the threshold value is defined on the basis of a difference between maximum and minimum intensity in the aerial image.

12. The method as claimed in claim 7, wherein the at least one measurement section is purged with a purge medium.

13. The method as claimed in claim 7, wherein for at least one of the degrees of freedom in which the mask carrier can be moved, the setting of the positions is interferometrically checked, and if appropriate corrected, by at least two measurement sections.

14. The method of claim 12 in which the purge medium comprises at least one of nitrogen, argon, or helium.

15. The method of claim 12 in which the purge medium is provided locally to the at least one measurement section, the purge medium being provided from a purging nozzle located in a vicinity of the at least one measurement section.

16. An apparatus for measuring masks for photolithography, comprising
a movable mask carrier, which accommodates a mask,
a positioning device, which successively stops at predetermined positions on the mask at which structures to be measured are situated, such that a respective one of the structures is situated at a focus of an imaging optical system, which in each case generates an aerial image of the structure and images the structure onto an aerial detector,
an illumination device, which illuminates the mask and is set in a manner corresponding to an illumination in a photolithography scanner during a wafer exposure,
an evaluation unit, which evaluates the detected aerial images of the structures with regard to structure properties, to comply with predetermined tolerances;
wherein the positioning device comprises:
a sensor head,
a scanning head coupled to the sensor head and configured to scan a scale to determine a position of scanning head, from which a position of the mask is determined, and
a control unit that is configured to drive the scanning head to maintain a constant distance between the movable mask carrier and the sensor head based on an output signal of the sensor head.

17. The apparatus as claimed in claim 16, where the positioning device has for position determination at least one measurement rod coupled to the mask carrier.

18. The apparatus as claimed in claim 16, wherein the positioning device and the mask carrier are mounted on a sample table composed of Zerodur.

19. The apparatus as claimed in claim 16, which has polarization-active components serving for emulating vector effects.

20. The apparatus as claimed in claim 16, characterized in that the positions are predetermined on the basis of an input file.

21. The apparatus as claimed in claim 16, wherein the positioning device has for position determination at least one interferometric measurement section coupled to the mask carrier.

22. The apparatus as claimed in claim 21, wherein the positioning device has two interferometric measurement sections for each degree of freedom in which the mask carrier can be moved.

23. The apparatus as claimed in claim 21, comprising a purging device for purging at least one of the measurement sections with a purge medium.

24. The apparatus of claim 23 in which the purge medium comprises at least one of nitrogen, argon, or helium.

25. The apparatus of claim 23 in which the purging device comprises a purging nozzle located in a vicinity of one of the measurement sections for locally providing the purge medium to the measurement section.

* * * * *